(12) United States Patent
Fuchigami et al.

(10) Patent No.: US 6,351,416 B2
(45) Date of Patent: Feb. 26, 2002

(54) CURRENT SENSE AMPLIFIER CIRCUIT

(75) Inventors: Ikuo Fuchigami; Tomonori Kataoka; Youichi Nishida; Tomoo Kimura; Jyunji Michiyama, all of Fukuoka; Satoshi Kohtaka, Kumamoto, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/796,806

(22) Filed: Mar. 2, 2001

(30) Foreign Application Priority Data

Mar. 2, 2000 (JP) ........................................ 2000-057576

(51) Int. Cl.[7] .............................................. G11C 16/06
(52) U.S. Cl. .............. 365/185.21; 365/207; 365/185.23
(58) Field of Search ....................... 365/185.21, 185.22, 365/185.23, 205, 207, 208, 210, 189.01, 189.09, 185.25

(56) References Cited

U.S. PATENT DOCUMENTS

| | | | |
|---|---|---|---|
| 5,654,918 A | 8/1997 | Hammick | 365/185.2 |
| 5,805,500 A | * 9/1998 | Campardo et al. | 365/185.2 |
| 5,838,612 A | 11/1998 | Calligaro et al. | 365/185.03 |
| 5,841,698 A | * 11/1998 | Hirano et al. | 365/185.21 |
| 5,886,925 A | * 3/1999 | Campardo et al. | 365/185.21 |

* cited by examiner

Primary Examiner—David Nelms
Assistant Examiner—Gene N. Auduong
(74) Attorney, Agent, or Firm—Wenderoth, Lind & Ponack, L.L.P.

(57) ABSTRACT

A current sense amplifier circuit is provided with a reference current generator for generating a reference current according to the characteristics of a memory cell, and a current comparator, and the current comparator compares the memory cell current with the reference current. Thereby, the range of the operating power supply voltage is increased. Further, a current sense amplifier circuit is provided with plural sets of reference current generators and current comparators, and the reference current generators generate reference currents of different amounts corresponding to plural states the memory cell can take, and the current comparators compare the respective reference currents with the memory cell current. Therefore, it is possible to detect the current in the memory cell that is set in multiple states.

12 Claims, 7 Drawing Sheets

US 6,351,416 B2

CURRENT SENSE AMPLIFIER CIRCUIT

FIELD OF THE INVENTION

The present invention relates to a current sense amplifier circuit for detecting a current passing through a memory cell of a nonvolatile semiconductor memory device.

BACKGROUND OF THE INVENTION

FIG. 7 is a diagram illustrating an example of a conventional current sense amplifier circuit.

In FIG. 7, M1 denotes an N type MOS transistor, having a source connected to a ground voltage and a gate connected to an input terminal N1 of the circuit. M2 denotes a P type MOS transistor, having a source connected to a power supply voltage, a gate connected to the ground voltage, and a drain connected to a drain of the N type MOS transistor M1. M3 denotes an N type MOS transistor, having a source connected to the input terminal N1 of the circuit and a gate connected to a drain of the P type MOS transistor M2. M4 denotes a P type MOS transistor, having a source connected to the power supply voltage, a gate connected to the ground voltage, and a drain connected to a drain of the N type MOS transistor M3. X1 denotes a first inverter, having an input terminal connected to the drain of the P type MOS transistor M4 and an output terminal connected to an output terminal N2 of the circuit. M5 denotes a memory cell of a floating gate type MOS transistor, and storage is realized using two states, i.e., a state where a current flows and a state where no current flows, by controlling the threshold voltage of the memory cell. M6 denotes a bit line selection gate transistor.

The N type MOS transistor M1 and the P type MOS transistor M2 constitute a second inverter X2 having an input terminal connected to the input terminal N1 of the circuit and an output terminal connected to the gate of the N type MOS transistor M3.

In the conventional current sense amplifier circuit so constructed, the output from the inverter X2 controls the N type MOS transistor M3 according to the voltage at the input terminal N1, whereby the voltage at the input terminal N1 is controlled. That is, when the voltage at the input terminal N1 is lower than the threshold voltage of the inverter X2, the inverter X2 outputs a "H" level voltage, whereby the N type MOS transistor M3 is turned on, and the input terminal N1 is charged. On the other hand, when the voltage at the input terminal N1 is higher than the threshold voltage of the inverter X2, the inverter X2 outputs a "L" level voltage, whereby the N type MOS transistor M3 is turned off, and charging is stopped. Accordingly, the inverter X2 serves as a damper to limit the voltage at the input terminal N1 to the threshold voltage of the inverter X2.

With the voltage at the input terminal N1 being held as described above, when the memory cell is in the state where a current flows, the memory cell current flows from the P type MOS transistor M4 through the N type transistor M3 and, at this time, the voltage at the drain of the P type MOS transistor M4 becomes lower than the power supply voltage according to the drain current vs. source-to-drain voltage characteristics of the P type MOS transistor M4, and a "H" level voltage is output to the output terminal N2 of the circuit by the inverter X1. On the other hand, when the memory cell is in the state where no current flows, the voltage at the drain of the P type MOS transistor is equal to the power supply voltage, and a "L" level voltage is output to the output terminal of the circuit by the inverter X1.

In the conventional current sense amplifier circuit, the detected amount of current depends on the characteristics of the P type MOS transistor M4, and the characteristics of the P type MOS transistor M4 intersect the characteristics of the memory cell in the erase state and the write state, whereby the operating power supply voltage is restricted.

Further, in the conventional current sense amplifier circuit, two states, i.e., whether the memory cell current exceeds a predetermined amount of current or not, are detected. So, when data is read from a memory cell, which is set in multiple states, by changing the load on the P type MOS transistor M4, it is difficult to secure a wide range of operating power supply voltage. Therefore, the conventional circuit is not adapted to readout of data from a memory cell which is set in multiple states (three or more states).

SUMMARY OF THE INVENTION

The present invention is made to solve the above-described problems and has for its object to provide a current sense amplifier circuit that secures a wide range of operating power supply voltage, and that is adaptable to readout of data from a memory cell which is set in multiple states (three or more states).

Other objects and advantages of the invention will become apparent from the detailed description that follows. The detailed description and specific embodiments described are provided only for illustration since various additions and modifications within the scope of the invention will be apparent to those of skill in the art from the detailed description.

In order to solve the problem about the restriction of the operation range with respect to the power supply voltage, a current sense amplifier circuit of the present invention is provided with a reference current generator and a current comparator, and the current comparator compares a reference current according to the characteristics of a memory cell with a memory cell current. Thereby, a broad operation range is obtained with respect to the power supply voltage or the like.

Further, in order to realize detection of current in the memory cell which is set in multiple states, a current sense amplifier circuit of the present invention is provided with plural sets of reference current generators and current comparators, and the reference current generators generate reference currents of different amounts corresponding to plural states the memory cell can take, and the current comparators compare the respective reference currents with the memory cell current. Therefore, it is possible to detect the current in the memory cell which is set in multiple states, thereby increasing the recording density of the memory cell.

DETAILED DESCRIPTION OF THE PREFERRED EMBODIMENTS

[Embodiment 1]

Figure 1:
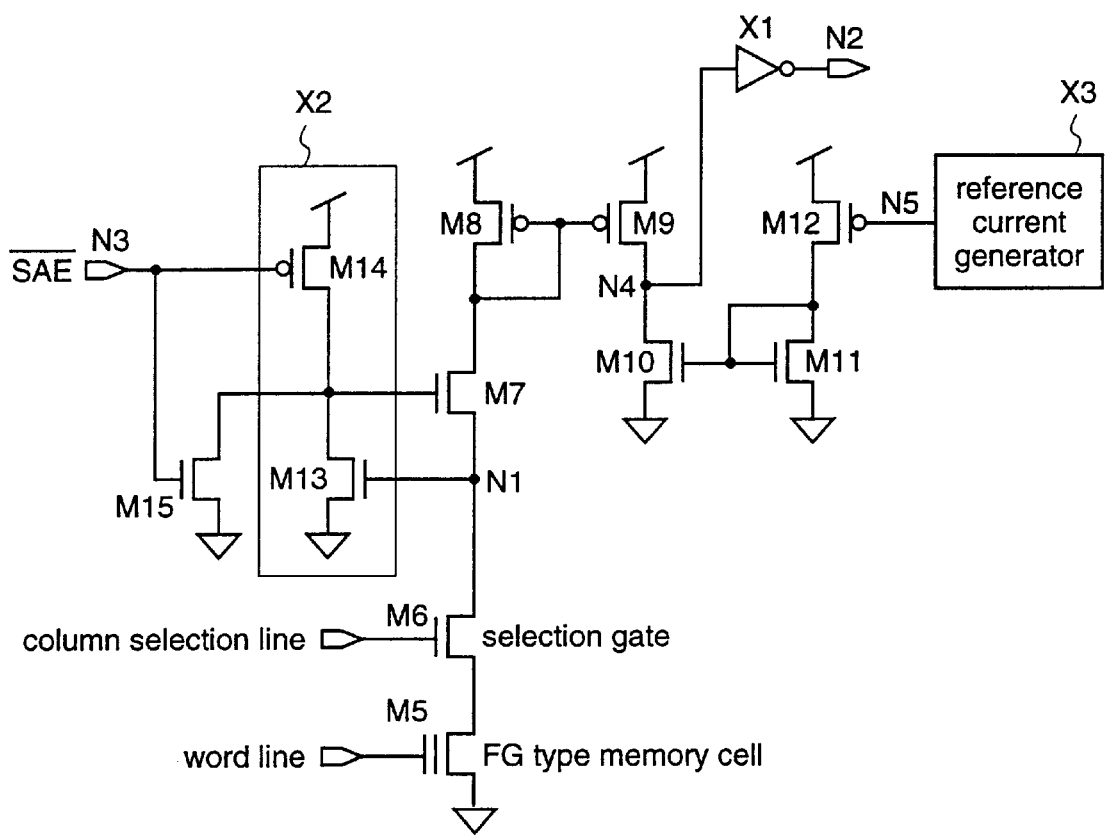
FIG. 1 is a circuit diagram illustrating a current sense amplifier circuit according to a first embodiment of the present invention.

FIG. 1 is a diagram illustrating the construction of a current sense amplifier circuit according to a first embodiment of the present invention. In FIG. 1, M7, M10, M11, M13, and M15 denote N type MOS transistors, and M8, M9, M12, and M14 denote P type MOS transistors. Further, M5 denotes an FG (Floating Gate) type memory cell, M6 denotes a column gate (selection transistor), X1 denotes a first inverter, X2 denotes a second inverter comprising the N type MOS transistor M13 and the P type MOS transistor M14, and X3 denotes a reference current generator.

The FG type memory cell M5 is one memory cell selected from plural memory cells arranged in an array, and a word line for selecting a row is connected to a control gate of the memory cell M5. The column gate M6 is connected so as to select a column of the memory cell M5. The column gate M6 has a gate connected to a column selection line for selecting a column, and a drain connected to an input node N1.

The N type MOS transistor M7 (first N type MOS transistor) has a source connected to the input node N1, a gate connected to a drain of the N type MOS transistor M13, and a drain connected to a drain of the P type MOS transistor M8 (first P type MOS transistor).

The N type MOS transistor M13 has a source connected to a ground voltage, and a gate connected to the input node N1.

The N type MOS transistor M15 has a source connected to the ground voltage, a gate connected to an input terminal N3, and a drain connected to the gate of the N type MOS transistor M7.

The P type MOS transistor M14 has a source connected to the power supply voltage, a gate connected to the input terminal N3, and a drain connected to the gate of the N type MOS transistor M7.

The P type MOS transistor M8 (first P type MOS transistor) has a source connected to the power supply voltage, and a gate and a drain which are connected to the drain of the N type MOS transistor M7 (first N type MOS transistor).

The P type MOS transistor M9 (second P type MOS transistor) has a source connected to the power supply voltage, a gate connected to the drain of the P type MOS transistor M8 (first P type MOS transistor), and a drain connected to a node N4.

The N type MOS transistor M10 (second N type MOS transistor) has a source connected to the ground voltage, and a drain connected to the node N4.

The N type MOS transistor M11 (third N type MOS transistor) has a source connected to the ground voltage, and a gate and a drain which are connected to the gate of the N type MOS transistor M10 (second N type MOS transistor).

The P type MOS transistor M12 (third P type MOS transistor) has a source connected to the power supply voltage, a gate connected to a node N5, and a drain connected to the drain of the N type MOS transistor M11 (third N type MOS transistor).

The inverter X1 has an input terminal connected to the node N4, and an output terminal connected to the output node N2.

The reference current generator X3 is connected to the node N5.

The reference current generator X3 applies a voltage to the gate of the P type MOS transistor M12 so that the amount of drain current of the P type MOS transistor M12 (third P type MOS transistor) becomes equal to a predetermined amount of reference current.

Hereinafter, a description will be given of the operation of the current sense amplifier circuit constructed as described above.

A positive voltage is applied to the column selection line of the column gate M6 which is selected at operation, and a positive voltage is applied to the word line of the FG type memory cell M5 which is selected. The FG type memory cell is in either a state where a cell current flows (hereinafter referred to as "0" state) or a state where no cell current flows (hereinafter referred to as "1" state), according to recorded data.

When a SAE (Sense Amplifier Enable) signal applied to the input node N3 is "H", the inverter X2 comprising the N type MOS transistor M13 and the P type MOS transistor M14 has the job of controlling the N type MOS transistor M7 (first N type MOS transistor) by the voltage at the node N1, and clamping the voltage at the node N1 to a logical inverse voltage of the inverter X2, whereby the voltage at the input node N1 is kept constant. At this time, the cell current flowing through the memory cell M5 is supplied from the P type MOS transistor M8 (first P type MOS transistor) through the N type MOS transistor M7. A current mirror circuit comprising the P type MOS transistors M8 (first P type MOS transistor) and M9 (second P type MOS transistor) operates so that a current having a value equal or proportional to the cell current flows through the P type MOS transistor M9 (second P type MOS transistor).

On the other hand, the reference current generator X3 operates so that a reference current having a predetermined value flows through the P type MOS transistor M12 (third P type MOS transistor). A current mirror circuit comprising the N type MOS transistors M10 (second N type MOS transistor) and M11 (third N type MOS transistor) operates so that the reference current flows through the N type MOS transistor M10 (second N type MOS transistor).

The voltage at the node N4 depends on the relative magnitudes of the current to be passed through the P type MOS transistor M9 (second P type MOS transistor) and the current to be passed through the N type MOS transistor M10 (second N type MOS transistor).

When the value of the cell current is larger than the value of the reference current, i.e., when the memory cell is in the "0" state, the node N4 shows "H". When the value of the cell current is smaller than the value of the reference current, i.e., when the memory cell is in the "1" state, the node N4 shows "L". The read data is output from the output node N2 through the inverter X1.

The reference current of the reference current generator is set so that it has a value between the cell current vs. power supply voltage characteristics of the memory cell in the "0" state and that of the memory cell in the "1" state, whereby a sense amplifier circuit having a wide range of operating power supply voltage is obtained.

Figure 2:
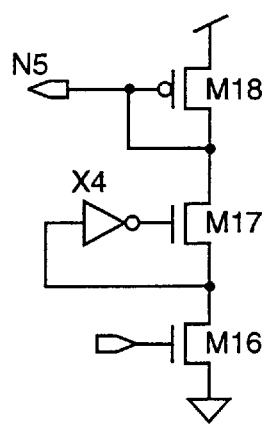
FIGS. 2a–2c is a circuit diagram illustrating the construction of a reference current generator included in the current sense amplifier circuit according to the first embodiment.
Figure 2:
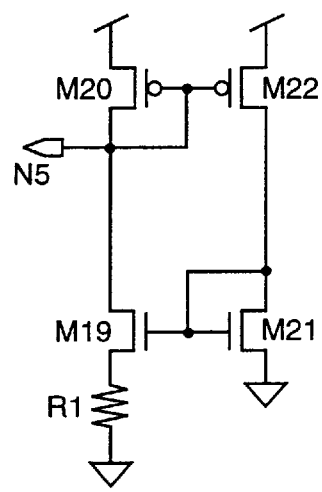
Figure 2:
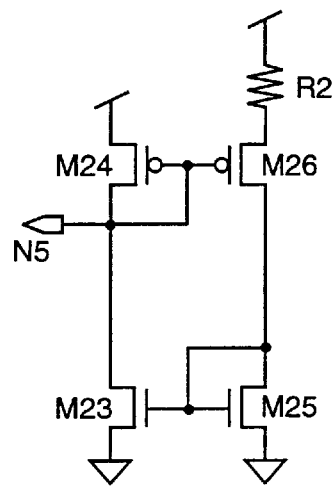

FIGS. 2(a)-2(c) show circuits as examples of the reference current generator X3.

FIG. 2(a) is an example of the reference current generator, wherein M16 and M17 denote N type MOS transistors (fifth and sixth N type MOS transistors), M18 denotes a P type MOS transistor (fifth P type MOS transistor), and X4 denotes an inverter.

The N type MOS transistor M16 may be an FG type memory cell for reference.

The N type MOS transistor M16 has a source connected to the ground voltage, and a gate to which the power supply voltage or a voltage equal to that applied to the selected word line is applied at operation. The N type MOS transistor M17 has a source connected to a drain of the N type MOS transistor M16. The inverter X4 has an input terminal connected to the drain of the N type MOS transistor M16, and an output terminal connected to the gate of the N type MOS transistor M17. The P type MOS transistor M18 has a source connected to the power supply voltage, and a gate and a drain which are connected to the drain of the N type MOS transistor M17. A node where the gate and drain of the transistor M18 and the drain of the transistor M17 join is an output node N5.

FIG. 2(b) shows another example of the reference current generator, wherein M19 and M21 denote N type MOS transistors (eighth and seventh N type MOS transistors), M20 and M22 denote P type MOS transistors (sixth and seventh P type MOS transistors), and R1 denotes a resistor.

The P type MOS transistor M20 has a source connected to the power supply voltage, and a gate and a drain which are connected to an output node N5. The N type MOS transistor M19 has a drain connected to the drain of the P type MOS transistor M20. The resistor R1 has an end connected to the ground voltage, and the other end connected to the source of the N type MOS transistor M19. The N type MOS transistor M21 has a source connected to the ground voltage, and a gate and a drain which are connected to the gate of the N type MOS transistor M19. The P type MOS transistor M22 has a source connected to the power supply voltage, a gate connected to the drain of the P type MOS transistor M20, and a drain connected to the drain of the N type MOS transistor M21.

The above-mentioned circuit constitutes a constant current circuit where a predetermined constant current, which is independent of the power supply voltage, flows. At this time, the value of the constant current depends on the resistance of the resistor R1, and the ratio in sizes of the N type MOS transistors M19 and M21.

FIG. 2(c) shows still another example of the reference current generator, where M23 and M25 denote N type MOS transistors (tenth and ninth N type MOS transistors), M24 and M26 denote P type MOS transistors (eighth and ninth P type MOS transistors), and R2 denotes a resistor.

The P type MOS transistor M24 has a source connected to the power supply voltage, and a gate and a drain which are connected to an output node N5. The N type MOS transistor M23 has a source connected to the ground voltage, and a drain connected to a drain of the P type MOS transistor M24. The N type MOS transistor M25 has a source connected to the ground voltage, and a gate and a drain which are connected to a gate of the N type MOS transistor M23. The P type MOS transistor M26 has a gate connected to the drain of the P type MOS transistor M24, and a drain connected to the drain of the N type MOS transistor M25. The resistor R2 has an end connected to the power supply voltage, and the other end connected to the source of the P type MOS transistor M26.

The above-described circuit constitutes a constant current circuit like the circuit shown in FIG. 2(b), where a predetermined constant current, which is independent of the power supply voltage, flows. The value of this constant current depends on the resistance of the resistor R2, and the ratio in sizes of the N type MOS transistors M23 and M25.

[Embodiment 2]

Figure 3:
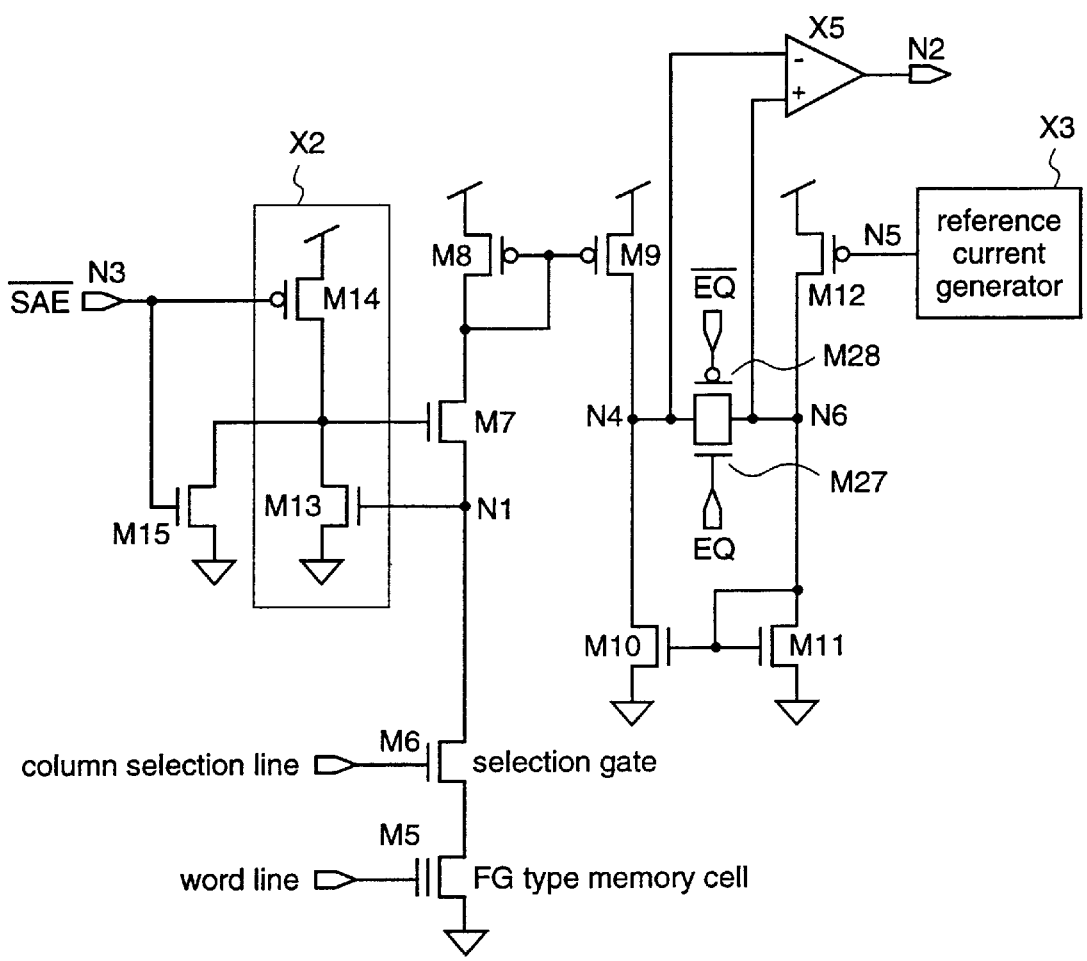
FIG. 3 is a circuit diagram illustrating a current sense amplifier circuit according to a second embodiment of the present invention.

FIG. 3 is a diagram illustrating the construction of a current sense amplifier circuit according to a second embodiment of the present invention.

In FIG. 3, the same reference numerals as those shown in FIG. 1 denote the same or corresponding parts. Further, M27 denotes an N type MOS transistor (fourth N type MOS transistor), M28 denotes a P type MOS transistor (fourth P type MOS transistor), and X5 denotes a comparator.

The current sense amplifier circuit according to this second embodiment is different from the current sense amplifier circuit according to the first embodiment shown in FIG. 1 in that an output circuit comprising the N type MOS transistor M27 (fourth N type MOS transistor), the P type MOS transistor M28 (fourth P type MOS transistor), and the comparator X5 is used instead of the output circuit comprising the inverter X1. Hereinafter, the second embodiment will be described with respect to this difference.

The N type MOS transistor M27 (fourth N type MOS transistor) has a gate connected to a control signal EQ, a source, and a drain. One of the source and the drain is connected to the drain of the N type MOS transistor M10 (second N type MOS transistor) while the other is connected to the drain of the N type MOS transistor M11 (third N type MOS transistor). The P type MOS transistor M28 (fourth P type MOS transistor) has a gate connected to an inverse signal of the control signal EQ, a source, and a drain. One of the source and the drain is connected to the drain of the N type MOS transistor M10 (second N type MOS transistor) while the other is connected to the drain of the N type MOS transistor M11 (third N type MOS transistor). The comparator X5 has an input terminal connected to the node N4, another input terminal connected to the node N6, and an output terminal connected to the output node N2.

Next, a description will be given of the operation of the current sense amplifier circuit so constructed. The control signal EQ is in the "H" state before start of sense operation, whereby the N type MOS transistor M27 (fourth N type MOS transistor) and the P type MOS transistor M28 (fourth P type MOS transistor) are turned on, and the node N4 and the node N6 are at the same voltage. When the circuit goes into sense operation, the control signal EQ becomes "L", whereby the N type MOS transistor M27 (fourth N type MOS transistor) and the P type MOS transistor M28 (fourth P type MOS transistor) are turned off. Thereby, a voltage difference according to the memory cell current occurs between the node N4 and the node N6, and the comparator X5 detects this voltage difference and outputs data. Thereby, high-speed sense operation is achieved.

[Embodiment 3]

Figure 4:
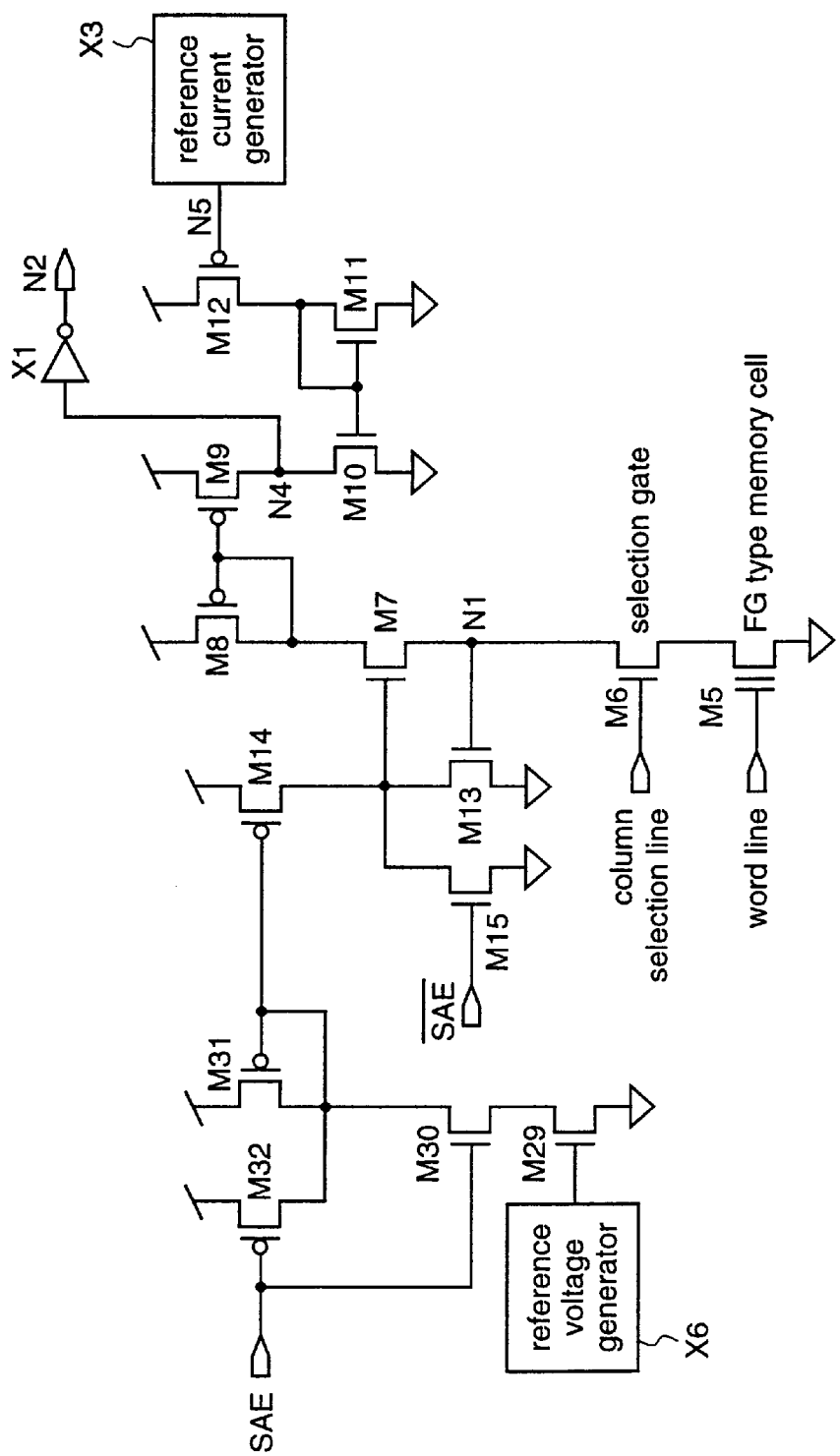
FIG. 4 is a circuit diagram illustrating a current sense amplifier circuit according to a third embodiment of the present invention.

FIG. 4 is a diagram illustrating the construction of a current sense amplifier circuit according to a third embodiment of the present invention.

In FIG. 4, the same reference numerals as those shown in FIG. 1 denote the same or corresponding parts. Further, M29 and M30 denote N type MOS transistors, M31 and M32 denote P type MOS transistors, and X6 denotes a reference voltage generator.

The current sense amplifier circuit of this third embodiment is different from the current sense amplifier circuit of the first embodiment shown in FIG. 1 in that a differential amplifier comprising the MOS transistors M13, M14, M31, M29, and M30 is used instead of the inverter X2. Hereinafter, the third embodiment will be described with respect to this difference.

The P type MOS transistor M31 has a source connected to the power supply voltage, and a gate and a drain which are connected to the gate of the P type MOS transistor M14. The P type MOS transistor M32 has a source connected to the power supply voltage, a gate connected to an enable signal SAE, and a drain connected to the drain of the P type MOS transistor M31. The N type MOS transistor M29 has a source connected to the ground voltage, and a drain connected to the source of the N type MOS transistor M30. The reference voltage generator X6 has an output terminal connected to the gate of the N type MOS transistor M29.

Next, a description will be given of the operation of the current sense amplifier circuit so constructed. When the enable signal SAE is "H" and the circuit is in the operating state, the P type MOS transistors M14 and M31 and the N type MOS transistors M13, M30, and M29 constitute a differential amplifier having, as input terminals, the gates of the N type MOS transistors M13 and M29. This differential amplifier amplifies a voltage difference between the reference voltage of the reference voltage generator X6 and the voltage at the node N1, and outputs it to the gate of the N type MOS transistor M7. This output controls the N type MOS transistor M7, and the voltage at the node N1 becomes equal to the reference voltage.

Thereby, the drain voltage of the FG type memory cell is constant independently of the power supply voltage, and a constant cell current which is independent of the power supply voltage is obtained when the word line voltage is regulated.

While the current sense amplifier circuit of this third embodiment is provided with the output circuit comprising the inverter X1 like the first embodiment, it may be provided with, like the second embodiment, an output circuit comprising an N type MOS transistor having a gate to which an equalization signal is applied, a P type MOS transistor having a gate to which an inverse signal of the equalization signal is applied, and a comparator.

[Embodiment 4]

Figure 5:
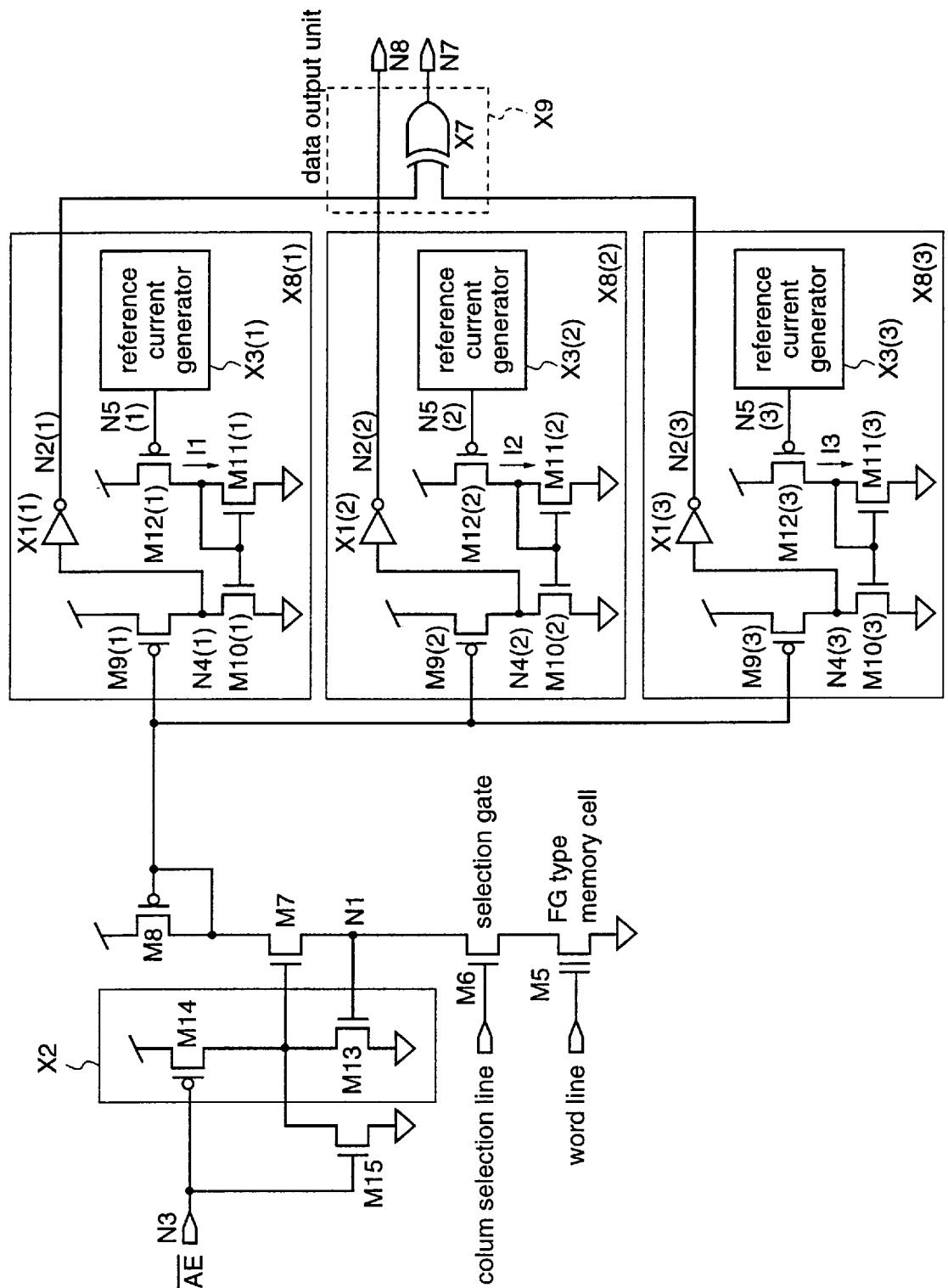
FIG. 5 is a circuit diagram illustrating a current sense amplifier circuit according to a fourth embodiment of the present invention.

FIG. 5 is a diagram illustrating the construction of a current sense amplifier circuit according to a fourth embodiment of the present invention.

In FIG. 5, the same reference numerals as those shown in FIG. 1 denote the same or corresponding parts. Further, M10(1)~M10(3) and M11(1)~M11(3) denote N type MOS transistors, M9(1)~M9(3) and M12(1)~M12(3) denote P type MOS transistors, X1(1)~X1(3) denote inverters, X3(1)~X3(3) denote reference current generators, X7 denotes an exclusive OR, X8(1)~X8(3) denote current comparators, and X9 denotes a data output unit.

The current sense amplifier circuit of this fourth embodiment is different from the current sense amplifier circuit of the first embodiment shown in FIG. 1 in that it has a plurality of current comparators X8 (in this case, three) each comprising N type MOS transistors M10 and M11, P type MOS transistors M9 and M12, an inverter X1, and a reference current generator X3, and the data output unit X9 receives the outputs from the respective current comparators. Hereinafter, the fourth embodiment will be described with respect to this difference.

The P type MOS transistor M9(1) has a source connected to the power supply voltage, a gate connected to the drain of the P type MOS transistor M8, and a drain connected to the node N4(1). The N type MOS transistor M10(1) has a source connected to the ground voltage, and a drain connected to the node N4(1). The N type MOS transistor M11(1) has a source connected to the ground voltage, and a gate and a drain which are connected to the gate of the N type MOS transistor M10(1). The P type MOS transistor M12(1) has a source connected to the power supply voltage, a gate connected to the node N5(1), and a drain connected to the drain of the N type MOS transistor M11(1). The inverter X1(1) has an input terminal connected to the node N4(1), and an output terminal connected to the output node N2(1). The reference current generator X3(1) is connected to the node N5(1).

The P type MOS transistor M9(1), the P type MOS transistor M12(1), the N type MOS transistor M10(1), the N type MOS transistor M11(1), the inverter X1(1), and the reference current generator X3(1) constitute the current comparator X8(1).

Likewise, the P type MOS transistor M9(2), the P type MOS transistor M12(2), the N type MOS transistor M10(2), the N type MOS transistor M11(2), the inverter X1(2), and the reference current generator X3(2) constitute the current comparator X8(2). Further, the P type MOS transistor M9(3), the P type MOS transistor M12(3), the N type MOS transistor M10(3), the N type MOS transistor M11(3), the inverter X1(3), and the reference current generator X3(3) constitute the current comparator X8(3). The data output unit X9 comprises the exclusive OR X7, and has input nodes N2(1)~N2(3) and output nodes N7 and N8.

Next, a description will be given of the operation of the current sense amplifier circuit so constructed. The reference current generators X3(1), X3(2), and X3(3) generate reference currents I1, I2, and I3 of different values, respectively, so that the relationship I1<I2<I3 is satisfied.

According to the respective reference currents, the current comparators X8(1)~X8(3) compare the reference currents with the cell current, and output data to the output nodes N2(1)~N2(3), respectively. Thereby, the current sense amplifier circuit can detect, according to the memory cell current I, the four states as follows: $0 \leq I < I1$ (state "3"), $I1 \leq I < I2$ (state "2"), $I2 \leq I < I3$ (state "1"), and $I3 \leq I$ (state "0").

The values (N2(1), N2(2), N2(3)) of the nodes N2(1)~N2(3) corresponding to the respective states to be detected are as follows: (H,H,H) in the state "3", (L,H,H) in the state "2", (L,L,H) in the state "1", and (L,L,L) in the state "0".

The data output unit X9 converts each of the above-mentioned four states to 2-bit data, and outputs it. More specifically, it outputs, as the values of the nodes N7 and N8, (1,0) for the state "3", (1,1) for the state "2", (0,1) for the state "1", and (0,0) for the state "0". Since the data output unit X9 outputs data by gray code, even when the output is deviated by one state in the current comparison process due to the proximity of the memory cell current value to the reference current value, the output data of the nodes N7 and N8 has only an error of one bit, resulting in an affinity with introduction of error correction.

While in this fourth embodiment the current sense amplifier circuit is provided with the input circuit using the inverter X2 as in the first embodiment, it may be provided with an input circuit using a differential amplifier as in the third embodiment.

[Embodiment 5]

Figure 6:
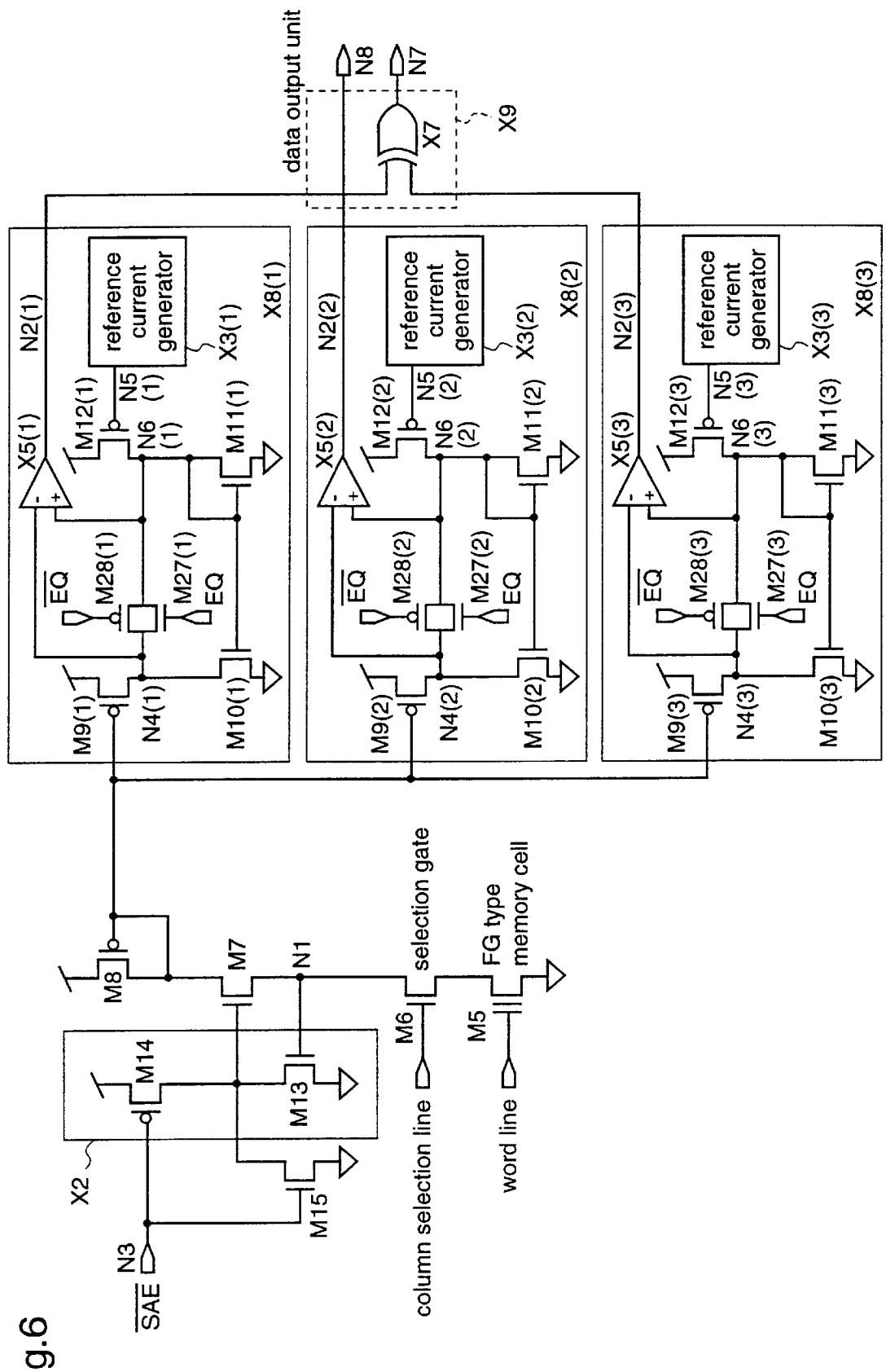
FIG. 6 is a circuit diagram illustrating a current sense amplifier circuit according to a fifth embodiment of the present invention.
Figure 7:
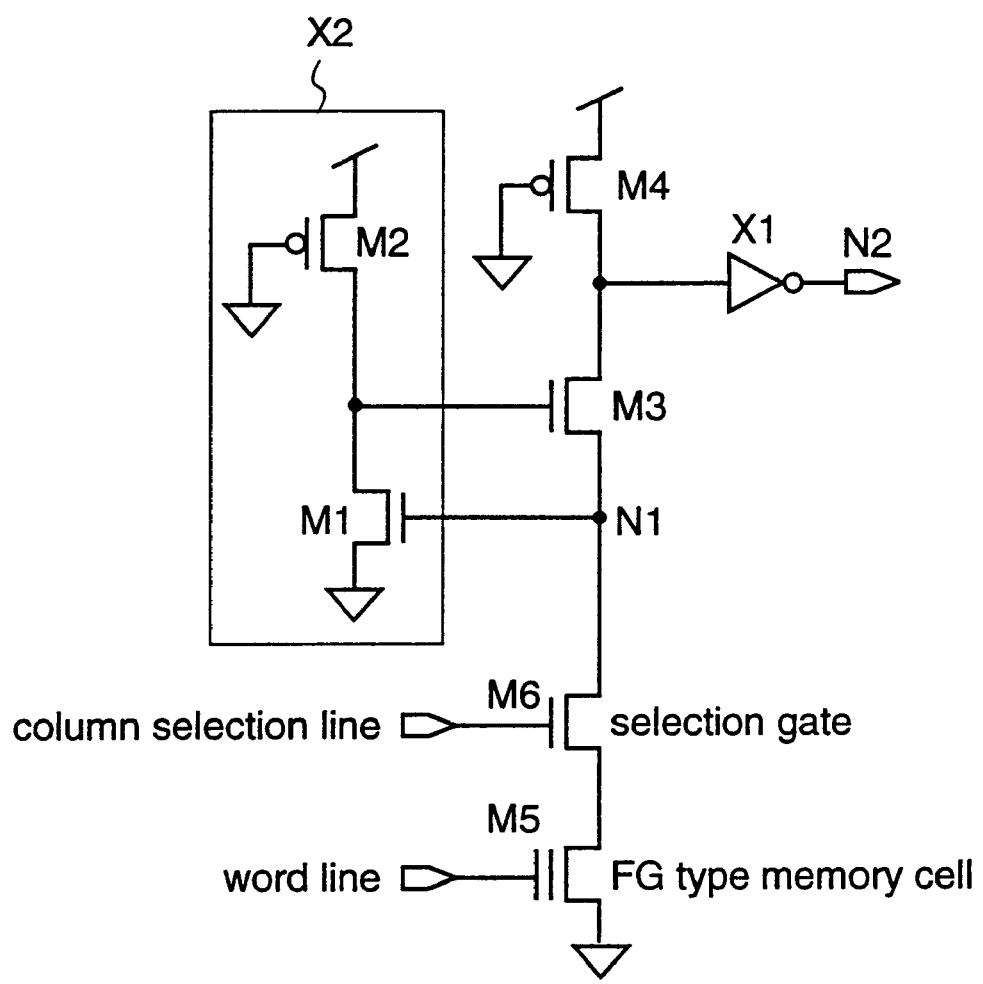
FIG. 7 is a circuit diagram illustrating a conventional current sense amplifier circuit.

FIG. 6 is a diagram illustrating the construction of a current sense amplifier circuit according to a fifth embodiment of the present invention.

In FIG. 6, the same reference numerals as those shown in FIG. 5 denote the same or corresponding parts. Further, M27(1)~M27(3) denote N type MOS transistors, M28(1)~M28(3) denote P type MOS transistors, and X5(1)~X5(3) denote inverters.

The current sense amplifier circuit of the fifth embodiment is different from the current sense amplifier circuit of the fourth embodiment shown in FIG. 5 in that output circuits comprising the N type MOS transistors M27(1)~M27(3), the P type MOS transistors M28(1)~M28(3), and comparators X5(1)~X5(3), respectively, are used instead of the output circuits comprising the inverters X1(1)~X1(3). Hereinafter, the fifth embodiment will be described with respect to this difference.

In the current comparator X8(1), the N type MOS transistor M27(1) has a gate connected to a control signal EQ, a source, and a drain. One of the source and the drain is connected to the drain of the N type MOS transistor M10(1), i.e., the node N4(1), while the other is connected to the drain of the N type MOS transistor M11(1), i.e., the node N6(1). The P type MOS transistor M28(1) has a gate connected to an inverse signal of the control signal EQ, a source, and a drain. One of the source and the drain is connected to the node N4(1) while the other is connected to the node N6(1). The comparator X5(1) has an input terminal connected to the node N4(1), another input terminal connected to the node N6(1), and an output terminal connected to the node N2(1). The current comparators X8(2) and X(3) have the same construction as that of the current comparator X8(1) described above.

Next, the operation of the current sense amplifier circuit so constructed will be described. The control signal EQ is in the "H" state before start of sense operation, and the N type MOS transistors M27(1)~M27 (3) and the P type MOS transistors M28(1)~M28(3) are in the ON states, and the nodes N4(1)~N4(3) and the nodes N6(1)~N6(3) are at the same voltage, respectively. When the circuit goes into sense operation, the control signal EQ becomes "L", and the N type MOS transistors M27(1)~M27 (3) and the P type MOS transistors M28(1)~M28(3) are turned off. Thereby, voltage differences according to the memory cell current occur between the nodes N4(1)~N4(3) and nodes N6(1)~N6(3), respectively, and the comparators X5(1)~X5(3) detect the respective voltage differences, and output data. Thus, high-speed sense operation is achieved.

While the current sense amplifier circuit according to this fifth embodiment is provided with the input circuit comprising the inverter X2 as in the first embodiment, it may be provided with an input circuit comprising a differential amplifier as in the third embodiment.

What is claimed is:

1. A current sense amplifier circuit connected to a data line to which a bit line of a memory cell array is connected through a selection transistor, comprising:

an inversion amplifier for receiving a voltage of the data line;

a first N type MOS transistor connected to the data line, and having a control node connected to the output of the inversion amplifier;

a first P type MOS transistor having a source connected to a power supply voltage, and a gate and a drain which are connected to each other and to the first N type MOS transistor;

a second P type MOS transistor having a source connected to the power supply voltage, and a gate connected to the gate of the first P type MOS transistor;

a second N type MOS transistor having a source connected to a ground voltage, and a drain connected to a drain of the second P type MOS transistor;

a third N type MOS transistor having a source connected to the ground voltage, and a gate and a drain which are connected to a gate of the second N type MOS transistor;

a third P type MOS transistor having a source connected to the power supply voltage, and a drain connected to the drain of the third N type MOS transistor;

an inverter having an input terminal connected to the drain of the second N type MOS transistor, and an output terminal being an output terminal of the circuit; and a reference current generator for applying a voltage to a gate of the third P type MOS transistor so that the amount of drain current of the third P type MOS transistor becomes equal to a predetermined amount of reference current;

wherein a memory cell current, which flows through the data line, is detected by comparing the amount of reference current with the amount of current at the data line.

2. A current sense amplifier circuit as defined in claim 1, wherein the reference current generator comprises:

a fifth N type MOS transistor having a source connected to the ground voltage, and a gate to which the power supply voltage or a predetermined bias voltage is applied;

a sixth N type MOS transistor having a source connected to the drain of the N type MOS transistor;

an inversion amplifier receiving a source voltage of the sixth N type MOS transistor, and outputting it to the gate of the sixth N type MOS transistor; and a fifth P type MOS transistor having a source connected to the power supply voltage, and a gate and a drain which are connected to each other and to the drain of the sixth N type MOS transistor;

wherein the drain of the fifth P type MOS transistor is the output of the reference current generator.

3. A current sense amplifier circuit as defined in claim 2, wherein the fifth N type MOS transistor is a memory cell.

4. A current sense amplifier circuit as defined in claim 1, wherein the reference current generator comprises:

a sixth P type MOS transistor having a source connected to the power supply voltage, and a gate and a drain connected to each other;

a seventh P type MOS transistor having a source connected to the power supply voltage, and a gate connected to the drain of the sixth P type MOS transistor;

a seventh N type MOS transistor having a source connected to the ground voltage, and a gate and a drain which are connected to each other and to the drain of the seventh P type MOS transistor;

an eighth N type MOS transistor having a gate connected to the drain of the seventh N type MOS transistor, and a drain connected to the drain of the sixth P type MOS transistor; and a resistor having an end connected to the ground voltage, and the other end connected to the source of the eighth N type MOS transistor;

wherein the drain of the sixth P type MOS transistor is the output of the reference current generator.

5. A current sense amplifier circuit as defined in claim 1, wherein the reference current generator comprises:

an eighth P type MOS transistor having a source connected to the power supply voltage, and a gate and a drain connected to each other;

a ninth P type MOS transistor having a gate connected to the drain of the eighth P type MOS transistor;

a ninth N type MOS transistor having a source connected to the ground voltage, and a gate and a drain which are connected to each other and to the drain of the ninth P type MOS transistor;

a tenth N type MOS transistor having a source connected to the ground voltage, a gate connected to the drain of the N type MOS transistor, and a drain connected to the drain of the eighth P type MOS transistor; and a resistor having an end connected to the power supply voltage, and the other end connected to the source of the second P type MOS transistor;

wherein the drain of the eighth P type MOS transistor is the output of the reference current generator.

6. A current sense amplifier circuit connected to a data line to which a bit line of a memory cell array is connected through a selection transistor, comprising:
   an inversion amplifier for receiving a voltage at the data line;
   a first N type MOS transistor connected to the data line, and having a control node connected to the output of the inversion amplifier;
   a first P type MOS transistor having a source connected to a power supply voltage, and a gate and a drain which are connected to each other and to the first N type MOS transistor; and
   n pieces of current comparators (n: integer not less than 2) connected to the drain of the first P type MOS transistor;
   each of the current comparators comprising:
      a second P type MOS transistor having a source connected to the power supply voltage, and a gate connected to the drain of the first P type MOS transistor;
      a second N type MOS transistor having a source connected to a ground voltage, and a drain connected to the drain of the second P type MOS transistor;
      a third N type MOS transistor having a source connected to the ground voltage, and a gate and a drain which are connected to a gate of the second N type MOS transistor;
      a third P type MOS transistor having a source connected to the power supply voltage, and a drain connected to the drain of the third N type MOS transistor;
      an inverter having an input terminal connected to the drain of the second N type MOS transistor, and an output terminal being an output terminal of the circuit; and
      a reference current generator for applying a voltage to a gate of the third P type MOS transistor so that the amount of drain current of the third P type MOS transistor becomes equal to a predetermined amount of reference current;
   wherein n pieces of reference current generators included in the n pieces of current comparators generate predetermined amounts of reference currents that are different from each other, and each current comparator compares the amount of reference current with the amount of current at the data line to detect the amount of memory cell current which flows through the data line.

7. A current sense amplifier circuit as defined in claim 6 further comprising a data conversion unit which receives read data having n+1 states indicated by the output values from the output terminals of the n pieces of current comparators, and associates the respective read data with gray codes according to the magnitudes of the detected currents of the data line, and outputs the data associated with the gray codes.

8. A current sense amplifier circuit as defined in claim 7 wherein:
   when n=3, an exclusive OR circuit is used as the data conversion unit, and the exclusive OR circuit is constructed such that the output of the first current comparator and the output of the third current comparator are connected to the input of the exclusive OR circuit, and the output of the exclusive OR circuit is regarded as a first output bit of the data converter while the output of the second current comparator is regarded as a second output bit of the data converter;
   whereby the read data indicated by the outputs of the n pieces of current comparators are converted to 2-bit gray codes to be output.

9. A current sense amplifier circuit as defined in claim 6, wherein the reference current generator comprises:
   a fifth N type MOS transistor having a source connected to the ground voltage, and a gate to which the power supply voltage or a predetermined bias voltage is applied;
   a sixth N type MOS transistor having a source connected to the drain of the N type MOS transistor;
   an inversion amplifier receiving a source voltage of the sixth N type MOS transistor, and outputting it to the gate of the sixth N type MOS transistor; and
   a fifth P type MOS transistor having a source connected to the power supply voltage, and a gate and a drain which are connected to each other and to the drain of the sixth N type MOS transistor;
   wherein the drain of the fifth P type MOS transistor is the output of the reference current generator.

10. A current sense amplifier circuit as defined in claim 9, wherein the fifth N type MOS transistor is a memory cell.

11. A current sense amplifier circuit as defined in claim 6, wherein the reference current generator comprises:
   a sixth P type MOS transistor having a source connected to the power supply voltage, and a gate and a drain connected to each other;
   a seventh P type MOS transistor having a source connected to the power supply voltage, and a gate connected to the drain of the sixth P type MOS transistor;
   a seventh N type MOS transistor having a source connected to the ground voltage, and a gate and a drain which are connected to each other and to the drain of the seventh P type MOS transistor;
   an eighth N type MOS transistor having a gate connected to the drain of the seventh N type MOS transistor, and a drain connected to the drain of the sixth P type MOS transistor; and
   a resistor having an end connected to the ground voltage, and the other end connected to the source of the eighth N type MOS transitor;
   wherein the drain of the sixth P type MOS transistor is the output of the reference current generator.

12. A current sense amplifier circuit as defined in claim 6, wherein the reference current generator comprises:
   an eighth P type MOS transistors having a source connected to the power supply voltage, and a gate and a drain connected to each other;
   a ninth P type MOS transistor having a gate connected to the drain of the eighth P type MOS transistor;
   a ninth N type MOS transistor having a source connected to the ground voltage, and a gate and a drain which are connected to each other and to the drain of the ninth P type MOS transistor;
   a tenth N type MOS transistor having a source connected to the ground voltage, a gate connected to the drain of the N type MOS transistor, and a drain connected to the drain of the eighth P type MOS transistor; and
   a resistor having an end connected to the power supply voltage, and the other end connected to the source of the second P type MOS transistor;
   wherein the drain of the eighth P type MOS transistor is the output of the reference current generator.

* * * * *